US008110470B2

(12) United States Patent
Tan et al.

(10) Patent No.: US 8,110,470 B2
(45) Date of Patent: Feb. 7, 2012

(54) ASYMMETRICAL TRANSISTOR DEVICE AND METHOD OF FABRICATION

(75) Inventors: Chung Foong Tan, Singapore (SG); Eng Huat Toh, Singapore (SG); Jae Gon Lee, Singapore (SG); Sanford Chu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 189 days.

(21) Appl. No.: 12/550,407

(22) Filed: Aug. 31, 2009

(65) Prior Publication Data
US 2011/0049625 A1   Mar. 3, 2011

(51) Int. Cl.
| H01L 21/027 | (2006.01) |
| H01L 21/02 | (2006.01) |
| H01L 29/06 | (2006.01) |
| H01L 29/41 | (2006.01) |
| H01L 29/772 | (2006.01) |

(52) U.S. Cl. ........ 438/303; 438/286; 257/327; 257/347; 257/E29.255; 257/E29.267; 257/E29.268

(58) Field of Classification Search .................. None
See application file for complete search history.

(56) References Cited

U.S. PATENT DOCUMENTS

| 5,477,070 | A |  | 12/1995 | Nam |
| 5,665,613 | A |  | 9/1997 | Nakashima et al. |
| 5,926,703 | A | * | 7/1999 | Yamaguchi et al. .......... 438/163 |
| 6,159,778 | A |  | 12/2000 | Kim |
| 6,225,148 | B1 | * | 5/2001 | Miyamoto et al. ............ 438/151 |
| 6,380,566 | B1 |  | 4/2002 | Matsudai et al. |
| 6,407,427 | B1 | * | 6/2002 | Oh ................. 257/347 |
| 6,534,373 | B1 | * | 3/2003 | Yu ................. 438/372 |
| 6,611,024 | B2 | * | 8/2003 | Ang et al. ...................... 257/350 |
| 7,202,118 | B1 |  | 4/2007 | Krivokapic |
| 7,410,876 | B1 | * | 8/2008 | Min et al. ...................... 438/301 |
| 7,608,868 | B2 | * | 10/2009 | Lee et al. ...................... 257/288 |
| 2002/0167050 | A1 |  | 11/2002 | Brown et al. |
| 2002/0197774 | A1 |  | 12/2002 | Xu et al. |
| 2005/0112808 | A1 |  | 5/2005 | Shibib et al. |

(Continued)

FOREIGN PATENT DOCUMENTS

DE    10343132 A1    4/2005

(Continued)

OTHER PUBLICATIONS

Saibal Mukhopadhyay et al., Device Design and Optimization Methodology for Leakage and Variability Reduction in Sub-45-nm FD/SOI SRAM, IEEE Transactions on Electron Devices, Jan. 2008, pp. 152-162, vol. 55 No. 1, IEEE-INST Electrical Electronics Engineers Inc, Piscataway, USA.

(Continued)

*Primary Examiner* — Benjamin Sandvik
*Assistant Examiner* — Joseph Schoenholtz
(74) *Attorney, Agent, or Firm* — Horizon IP Pte Ltd

(57) ABSTRACT

Embodiments of the invention provide an asymmetrical transistor device comprising a semiconductor substrate, a source region, a drain region and a channel region. The channel region is provided between the source and drain regions, the source, drain and channel regions being provided in the substrate. The device has a layer of a buried insulating medium provided below the source region and not below the drain region thereby forming an asymmetrical structure. The layer of buried insulating medium is provided in abutment with a lower surface of the source region.

27 Claims, 11 Drawing Sheets

U.S. PATENT DOCUMENTS

| | | | |
|---|---|---|---|
| 2005/0133789 | A1 | 6/2005 | Oh et al. |
| 2005/0133881 | A1 | 6/2005 | Oh et al. |
| 2005/0189589 | A1 | 9/2005 | Zhu et al. |
| 2006/0049467 | A1 | 3/2006 | Lim et al. |
| 2006/0084249 | A1 | 4/2006 | Yamada |
| 2006/0197158 | A1 | 9/2006 | Babcock et al. |
| 2006/0220130 | A1 | 10/2006 | Sato et al. |
| 2006/0244077 | A1 | 11/2006 | Nowak |
| 2007/0228465 | A1 | 10/2007 | Dyer et al. |
| 2008/0057635 | A1 | 3/2008 | Chen |
| 2008/0135924 | A1 | 6/2008 | Lebby et al. |
| 2008/0308867 | A1 | 12/2008 | Cai et al. |
| 2009/0096026 | A1 | 4/2009 | Bryant et al. |

FOREIGN PATENT DOCUMENTS

| | | |
|---|---|---|
| JP | 2030185 A | 1/1990 |
| JP | 2005150402 A | 6/2005 |
| KR | 100263475 B1 | 9/2000 |
| WO | 2008114167 A2 | 9/2008 |

OTHER PUBLICATIONS

Terence Kane et al., Electrical Characterization of sub-30nm Gatelength SOI MOSFETs, Proceedings from the 30th International Symposium for Testing and Failure Analysis, Nov. 14-18, 2004, pp. 33-37, ASM Int., USA.

V.P. Trivedi et al., Nanoscale FD/SOI CMOS: Thick or Thin Box?, IEEE Electron Device Letters, Jan. 2005, pp. 26-28, vol. 26 No. 1, IEEE.

Saibal Mukhopadhyay et al., Optimal UTB FD/SOI Device Structure Using Thin BOX for Sub-50-nm SRAM Design, IEEE Electron Device Letters, Apr. 2006, pp. 284-287, vol. 27 No. 4, IEEE-INST Electrical Electronics Engineers Inc, Piscataway, USA.

Jatmiko E. Suseno et al., Short Channel Effect of SOI Vertical Sidewall MOSFET, ICSE 2008 Proc., 2008, pp. 487-490, Johor Bahru, Malaysia.

Tony Ewert et al., Investigation of the electrical behaviour of an asymmetric MOSFET, Microelectronic Engineering, 2003, pp. 428-438, vol. 65, Elsevier Science B.V.

Yemin Dong et al., Patterned buried oxide layers under a single MOSFET to improve the device performance, Semiconductor Science and Technology, 2004, pp. L25-L28, vol. 19, IOP Publishing Ltd, UK.

Samaneh Sharbati et al., 6H-SiC lateral Power MOSFETs with an Asymmetrical Buried Oxide Double Step Structure, International Conference on Microwave and Millimeter Wave Technology, 2008, pp. 1755-1758, IEEE, Piscataway, USA.

M. Ferrier et al., Conventional Technological Boosters for Injection Velocity in Ultrathin-Body MOSFETs, IEEE Transactions on Nanotechnology, 2007, pp. 613-621, vol. 6 No. 6, Institute of Electrical and Electronics Engineers Inc., USA.

* cited by examiner

ASYMMETRICAL TRANSISTOR DEVICE AND METHOD OF FABRICATION

FIELD OF THE INVENTION

The present invention relates to a semiconductor device and to a method of fabricating the same. More particularly, the invention relates to a semiconductor device having a buried insulating layer and a method of fabricating the same.

DESCRIPTION OF THE RELATED ART

Semiconductor integrated circuits typically comprise a large number of MOS transistor devices. As the feature size of devices continues to decrease, a variety of phenomena can limit a performance of the devices, such as a value of a switching speed, a leakage current or any other suitable performance parameter.

FIG. 1 is a schematic illustration of a known MOS device 5. The device 5 has a source region 10, a drain region 30 and a channel region 20 between the source and drain regions 10, 30. A source side depletion region 12 is formed at a junction between the source region 10 and adjacent semiconductor material including the channel region 20. A drain side depletion region 32 is formed at a junction between the drain portion 30 and adjacent semiconductor material including the channel region 20.

The presence of the depletion regions 12, 32 introduces a capacitance between the source and channel regions 10, 20 and between the drain and channel regions 30, 20 known as a 'junction capacitance'. The junction capacitance can limit the performance of the transistor device.

In the course of normal operation of the MOS device, junctions between the source and channel regions 10, 20 and between the drain and channel regions 30, 20 are reverse biased. A size of the depletion regions 12, 32 increases as the magnitude of the respective reverse bias potentials increases, thereby decreasing the junction capacitance.

The source side depletion region 12 is typically narrower than the drain side depletion region 32. Thus capacitance introduced by the source side depletion region 12 typically dominates the junction capacitance.

SUMMARY OF THE INVENTION

Embodiments of the invention seek to mitigate at least some of the above mentioned problems.

Some embodiments of the invention provide a MOS transistor device structure having a decreased junction capacitance between the source and drain regions.

Some embodiments of the invention provide a MOS transistor having a reduced short channel effect.

In accordance with an embodiment of the invention there is provided a semiconductor device comprising: a semiconductor substrate; a source region, a drain region and a channel region, the channel region being provided between the source and drain regions, the source, drain and channel regions being provided in the substrate, the device having a layer of a buried insulating medium provided below the source region and not below the drain region, the layer of buried insulating medium below the source region being provided in abutment with a lower surface of the source region.

This has the advantage that a magnitude of a junction capacitance of the device associated with the source region may be reduced.

Furthermore, since the buried insulating medium does not extend under the drain region a thermal conductivity between the drain region and surrounding material is enhanced. This is at least in part because the buried insulating medium portion of the substrate has a lower thermal conductivity than semiconducting portions of the substrate. Thus, heat generated by current flow in the source, channel and drain regions may be dissipated more readily in structures according to embodiments of the invention than a structure in which the BOX layer extends under the source, channel and drain regions.

Optionally, the layer of insulating medium extends below the channel region. This has the advantage that a reduction in the junction capacitance under the gate electrode ($C_{jswg}$) may be achieved.

It is to be understood that a semiconductor device according to embodiments of the invention may be considered to have an asymmetrical structure since the buried insulating medium is provided below the source region but does not extend under the drain region.

In a second aspect of the invention there is provided a method of fabricating a semiconductor device comprising: providing a semiconductor substrate; forming a source region, a drain region and a channel region in the substrate, the channel region being provided between the source and drain regions, and providing a layer of a buried insulator material below the source region and not below the drain region, the buried insulator material being provided in abutment with a lower surface of the source region.

Some embodiments of the invention have the advantage that a magnitude of a junction capacitance between the source and drain regions of the transistor device may be reduced relative to known transistor devices.

In a third aspect of the invention there is provided a semiconductor device comprising: a semiconductor substrate comprising an upper semiconductor portion formed from silicon and a lower semiconductor portion formed from silicon, the upper and lower portions being separated by a layer of a buried oxide (BOX) medium; a source region, a drain region and a channel region provided in the upper semiconductor portion, the channel region being provided between the source and drain regions, wherein the BOX medium is provided below the source region and the channel region and not below the drain region, the BOX medium being provided in abutment with a lower surface of the source region.

In an aspect of the invention there is provided a method of fabricating a semiconductor device comprising: providing a semiconductor substrate; forming a source region, a drain region and a channel region in the substrate, the channel region being provided between the source and drain regions, a junction between the source and channel regions having a source junction capacitance; and providing a layer of a buried insulator material below the source region and not below the drain region thereby to reduce a value of the source junction capacitance, the buried insulator material being provided in abutment with a lower surface of the source region.

BRIEF DESCRIPTION OF THE DRAWINGS

Embodiments of the present invention will now be described hereinafter, by way of example only with reference to the accompanying drawings, in which.

DETAILED DESCRIPTION OF THE INVENTION

Figure 1:
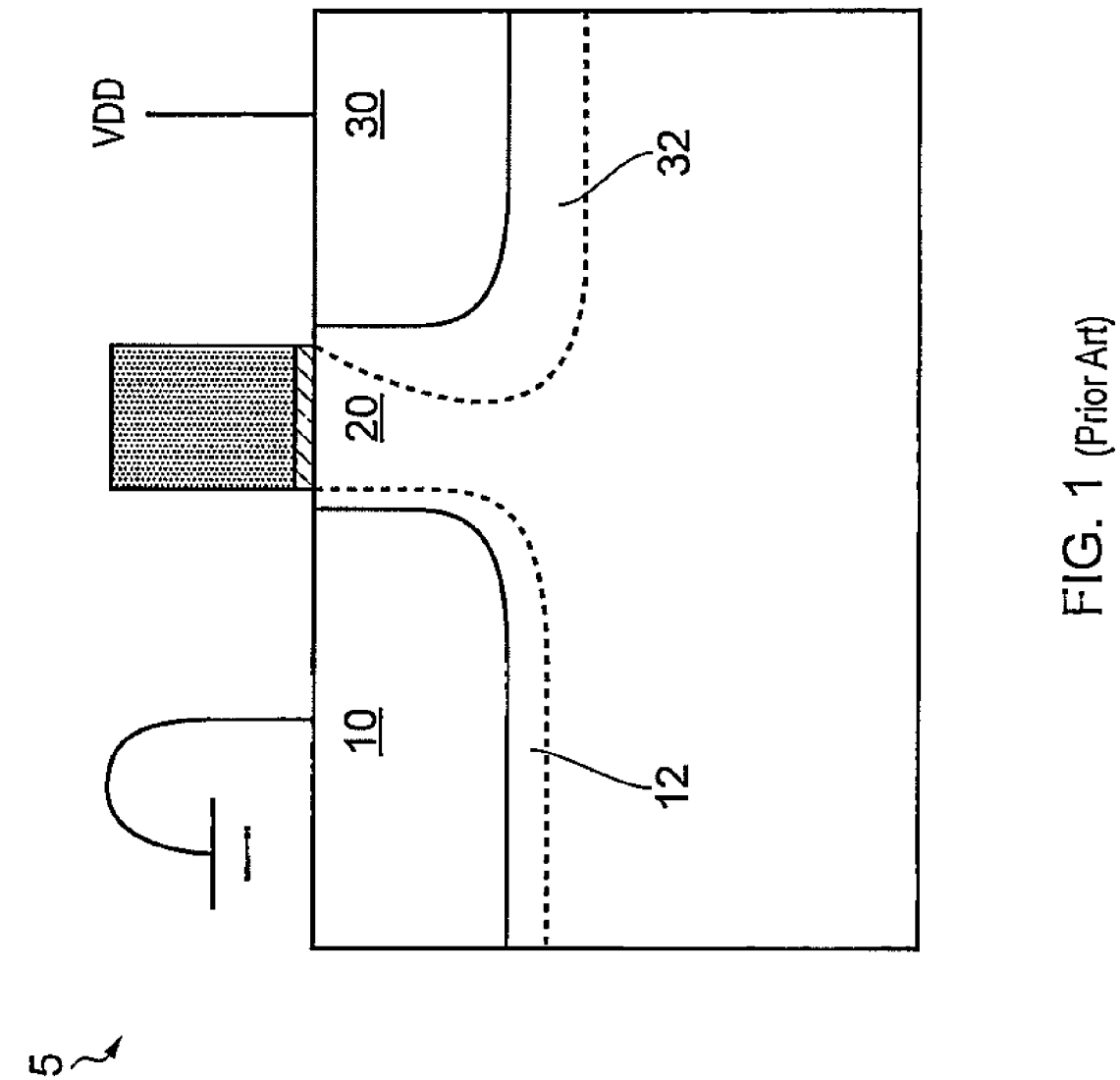
FIG. 1 is a schematic illustration of a prior art MOS device.
Figure 2:
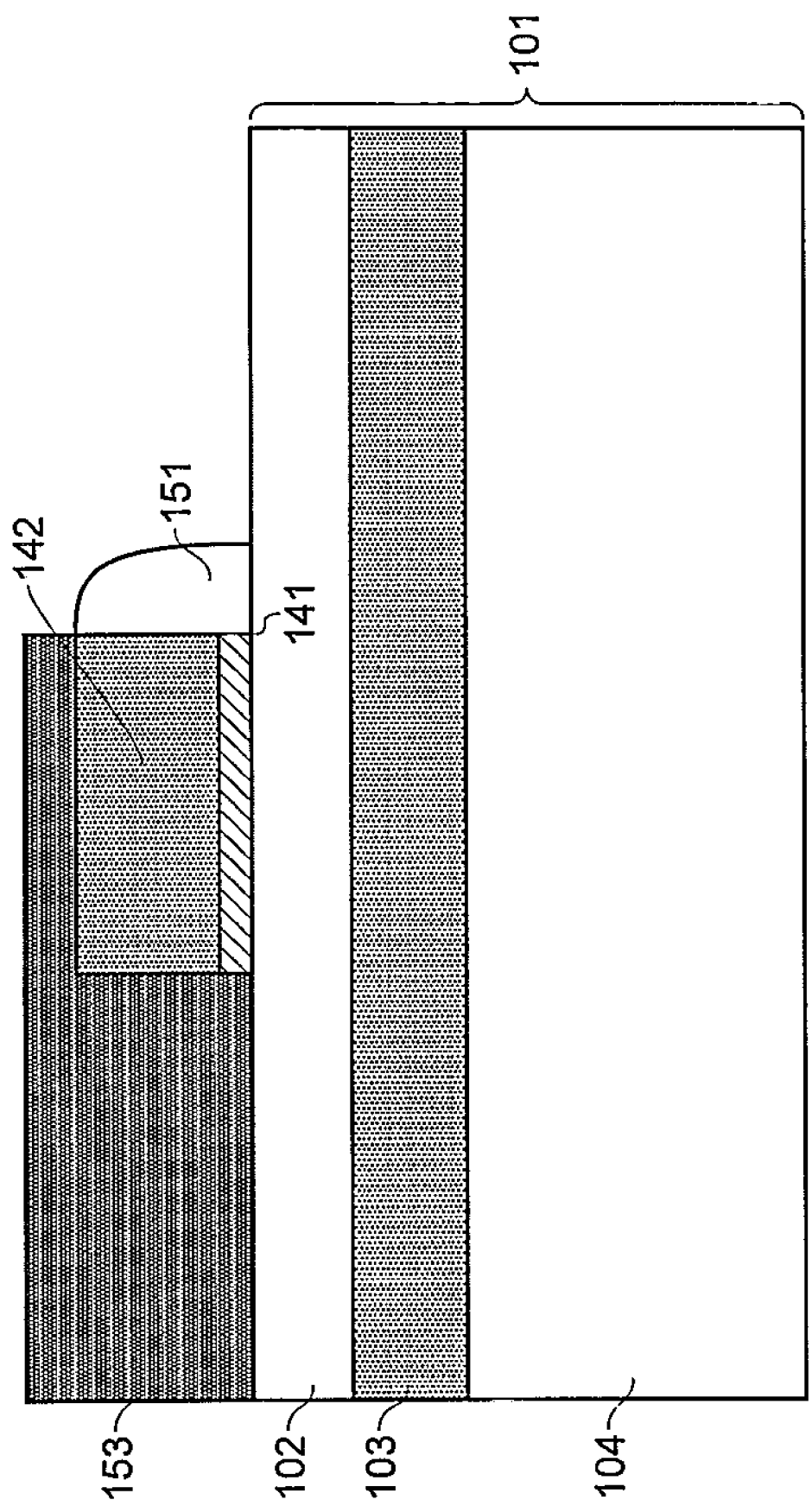
FIGS. 2 to 11 are schematic illustrations of a process of fabricating a MOS device according to embodiments of the present invention.

FIG. 2 shows a structure in which a substrate 101 is provided having a buried oxide (BOX) layer 103. The BOX layer 103 divides the substrate 101 into an upper semiconductor region 102 and a lower semiconductor region 104.

A gate stack is provided above the upper semiconductor region 102 of the substrate 101, the gate stack comprising a gate dielectric layer 141 and a gate electrode layer 142.

The gate dielectric layer 141 is formed from silicon oxide. Other materials are also useful such as silicon nitride, silicon oxynitride and any other suitable dielectric material.

The gate electrode layer 142 is formed from silicon. Other materials are also useful including other semiconductor materials or metallic materials.

A hardmask layer 153 has been formed over the substrate 101 and gate stack. The hardmask layer 153 has been patterned to expose a surface of a portion of the upper semiconductor region 102 of the substrate 101 where a drain region of the MOS device is to be formed. A gate stack spacer 151 has been formed over a sidewall of the gate stack on the side of the gate stack at which the drain region is to be formed.

Figure 3:
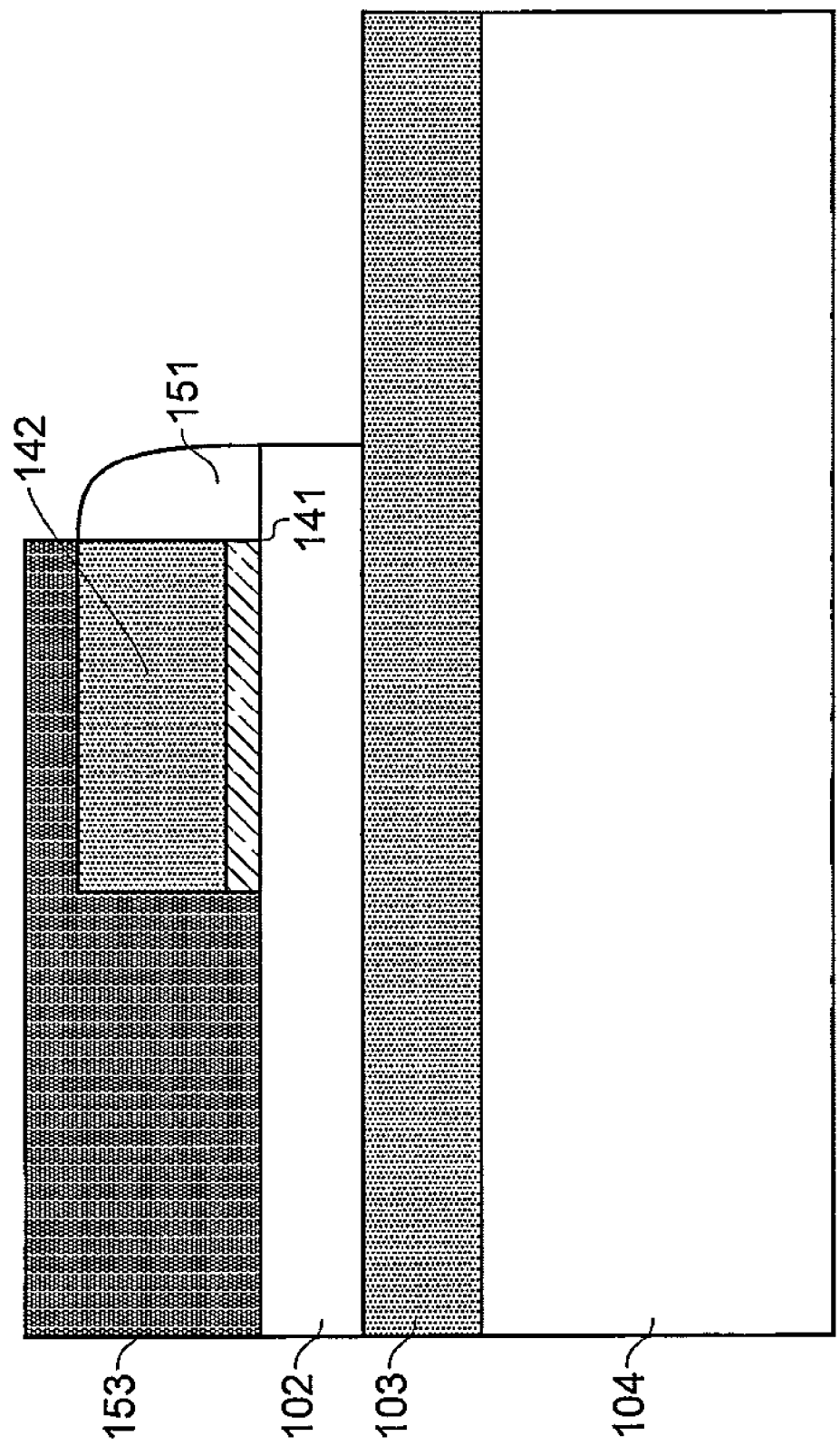

FIG. 3 shows the structure of FIG. 2 following an etching process in which etching of the substrate 101 is performed in order to remove the exposed portion of the upper semiconductor region 102 and expose a portion of the underlying BOX layer 103. Portions of the upper semiconductor region 102 below the gate stack spacer 151 and hardmask layer 153 remain following the etching process.

Figure 4:
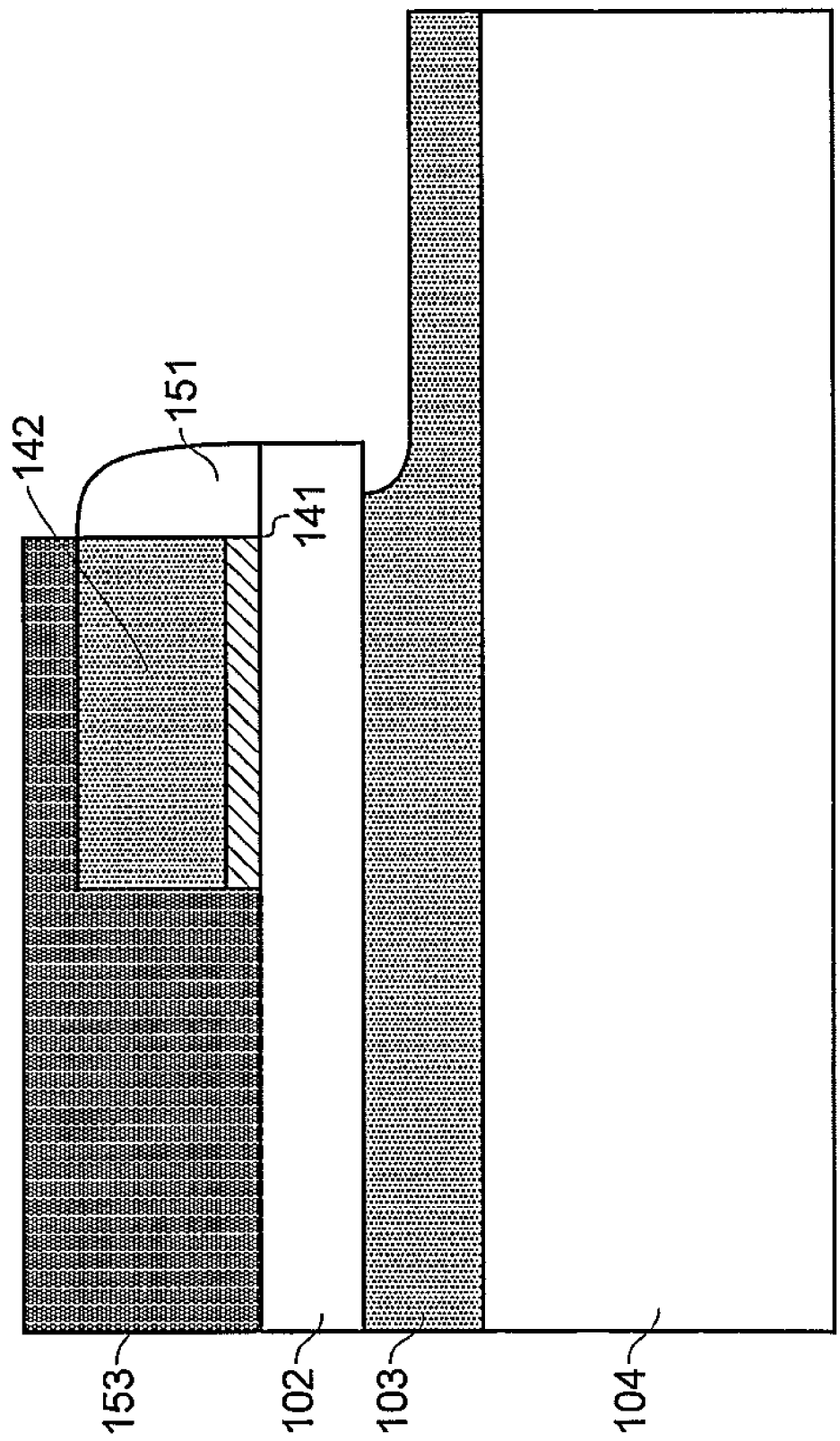

FIG. 4 shows the structure of FIG. 3 following an isotropic etching process in which etching of the exposed potion of the BOX layer 103 is performed in order to remove a portion of the BOX layer 103. Because the etching process is isotropic a portion of the BOX layer underlying the gate stack spacer 151 is also removed. This phenomenon may be referred to as 'necking'. The purpose of removing this portion of the BOX layer 103 is to reduce a problem of current crowding as current flows from the channel region to the drain region of the structure (see below).

Figure 5:
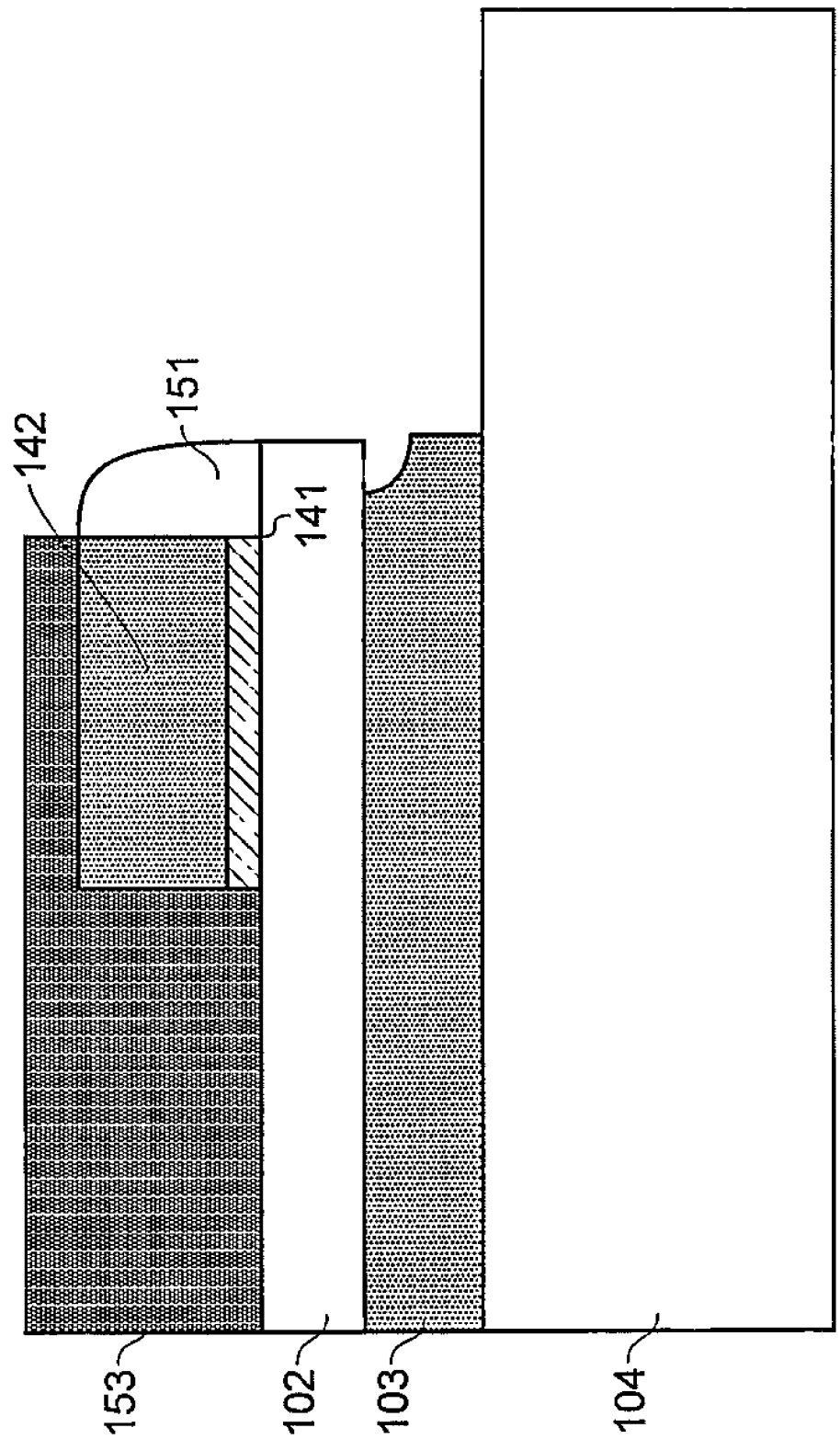

FIG. 5 shows the structure of FIG. 4 following an anisotropic (directional) etching process in which a remainder of the BOX layer 103 not underlying the hardmask layer 153 or gate stack spacer 151 is removed. A portion of the lower semiconductor region 104 of the substrate 101 is thereby exposed.

Figure 6:
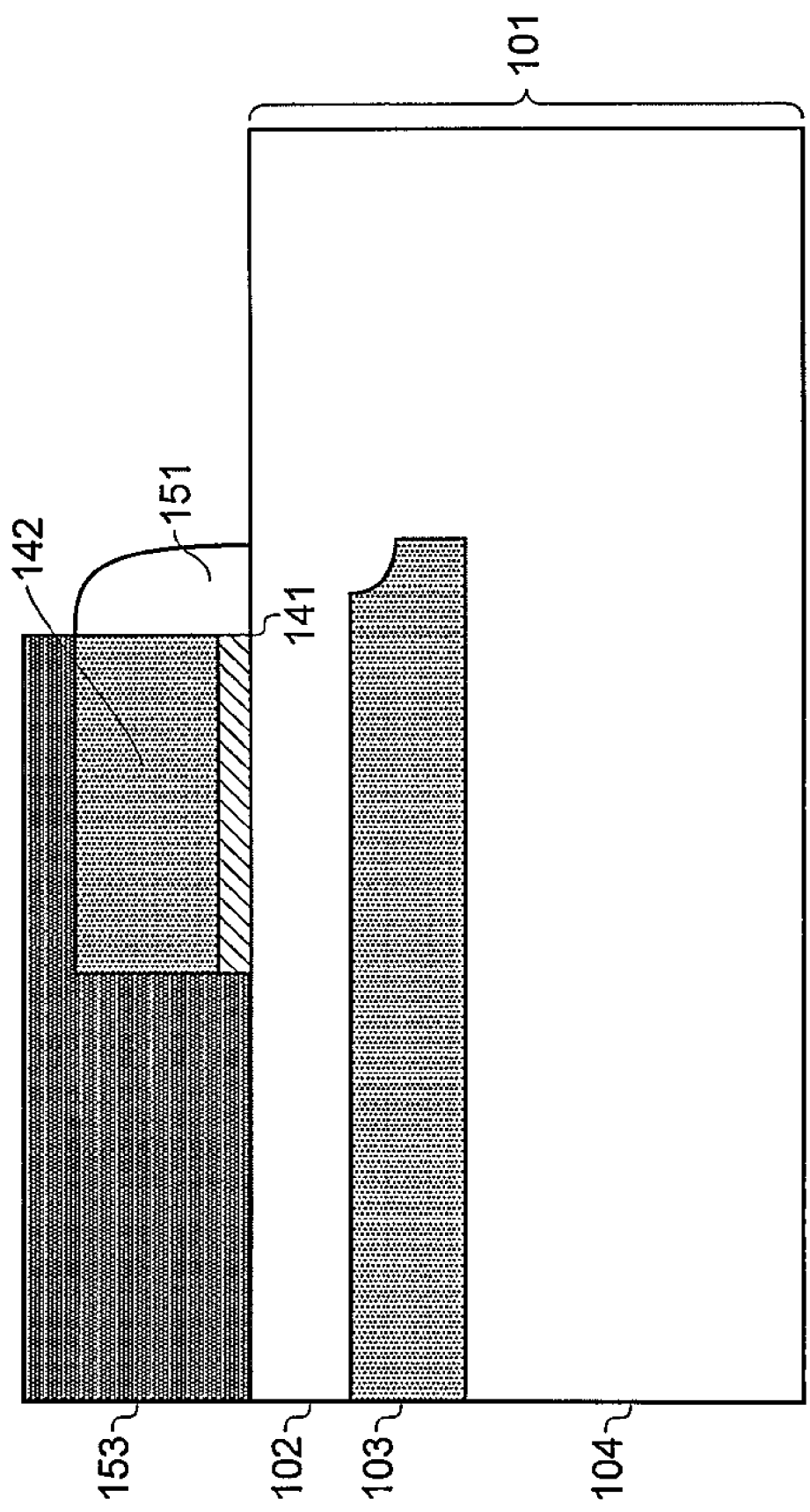

FIG. 6 shows the structure of FIG. 5 following re-growth of semiconductor material over the lower semiconductor region 104. Re-growth of semiconductor material is performed to a level of remaining portions of the upper semiconductor region 102.

Figure 7:
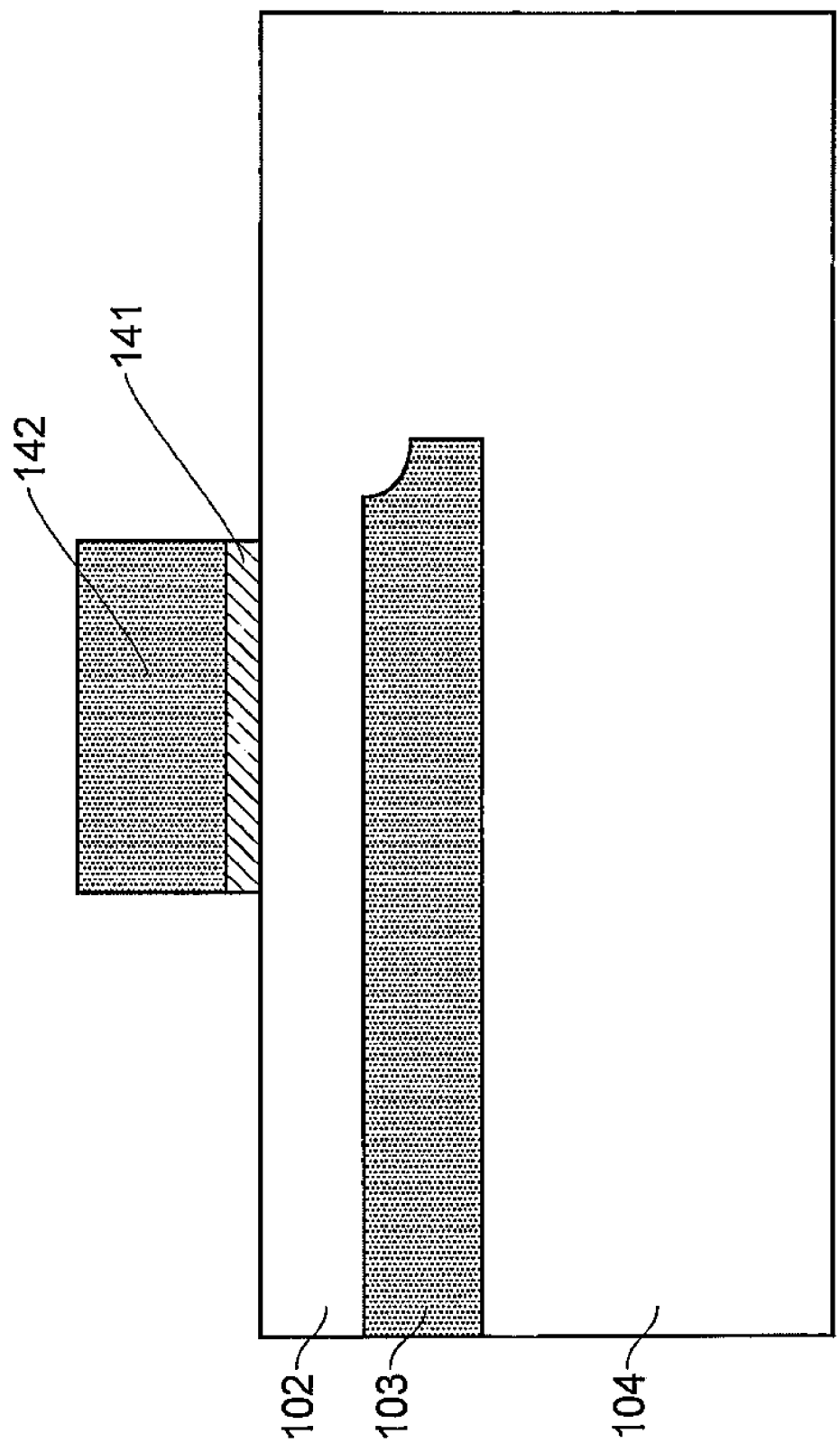

FIG. 7 shows the structure of FIG. 6 following removal of the hardmask layer 153 and gate stack spacer 151. The gate dielectric layer 141 and gate electrode layer 142 remain above the upper semiconductor region 102.

Figure 8:
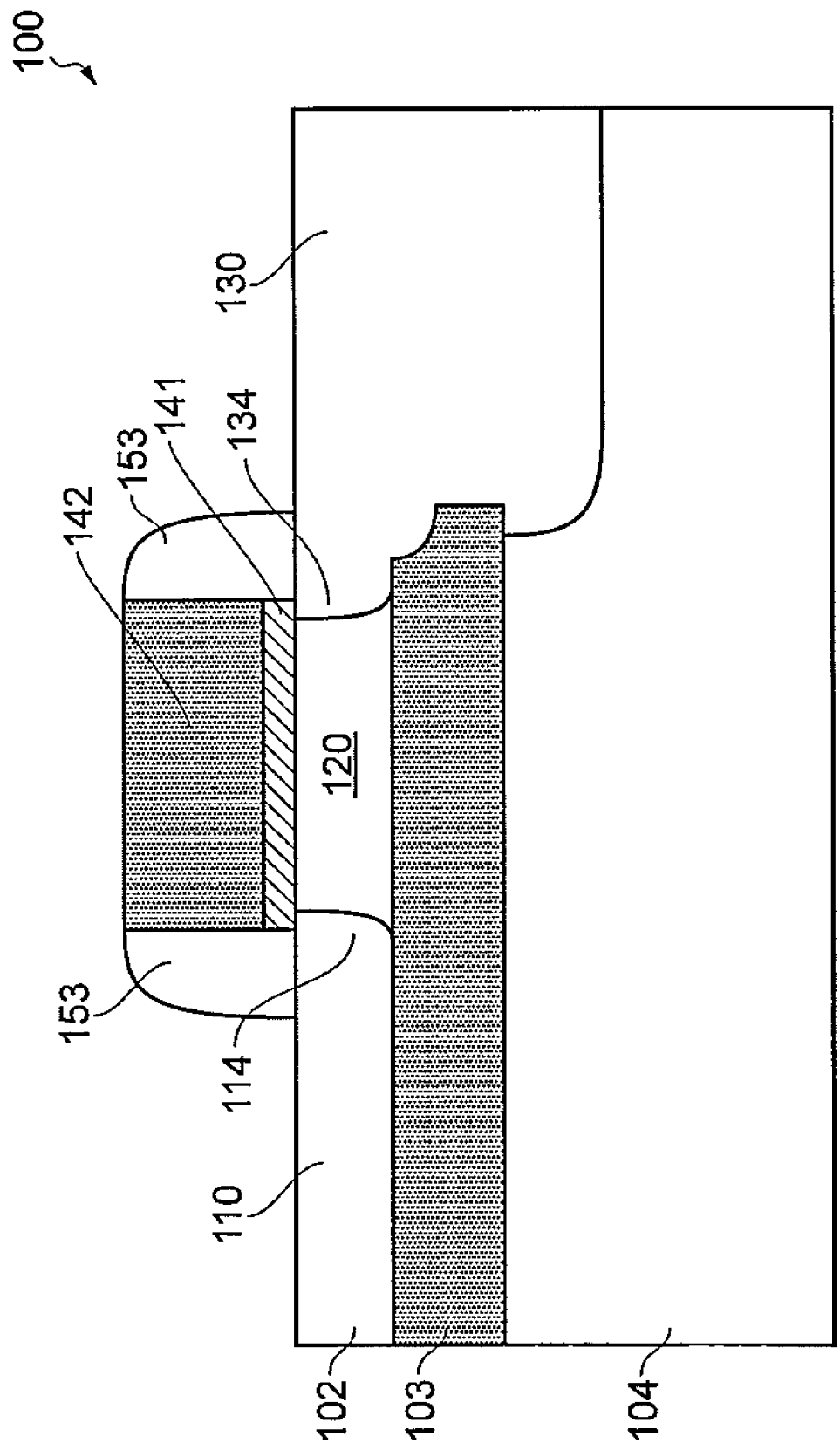

FIG. 8 shows the structure of FIG. 7 following a process of forming source and drain extension regions 114, 134 respectively, gate stack sidewall spacers 153 and source and drain regions 110, 130 respectively thereby to form a transistor structure 100. The drain region 130 of the embodiment of FIG. 8 has been formed to a depth below a level of the BOX layer 103 and may be referred to as a deep drain region 130.

In the embodiment of FIG. 8 the source and drain extension regions 114, 134 and source and drain regions 110, 130 are formed by implantation of dopant into the substrate 101. Other methods of introducing dopant into the substrate are also useful.

The extension regions 114, 134 may be of a different dopant concentration to the source and drain regions 110, 130 respectively. The extension regions 114, 134 may be lightly doped regions. The drain extension region may be a lightly doped drain (LDD) region.

Figure 9:
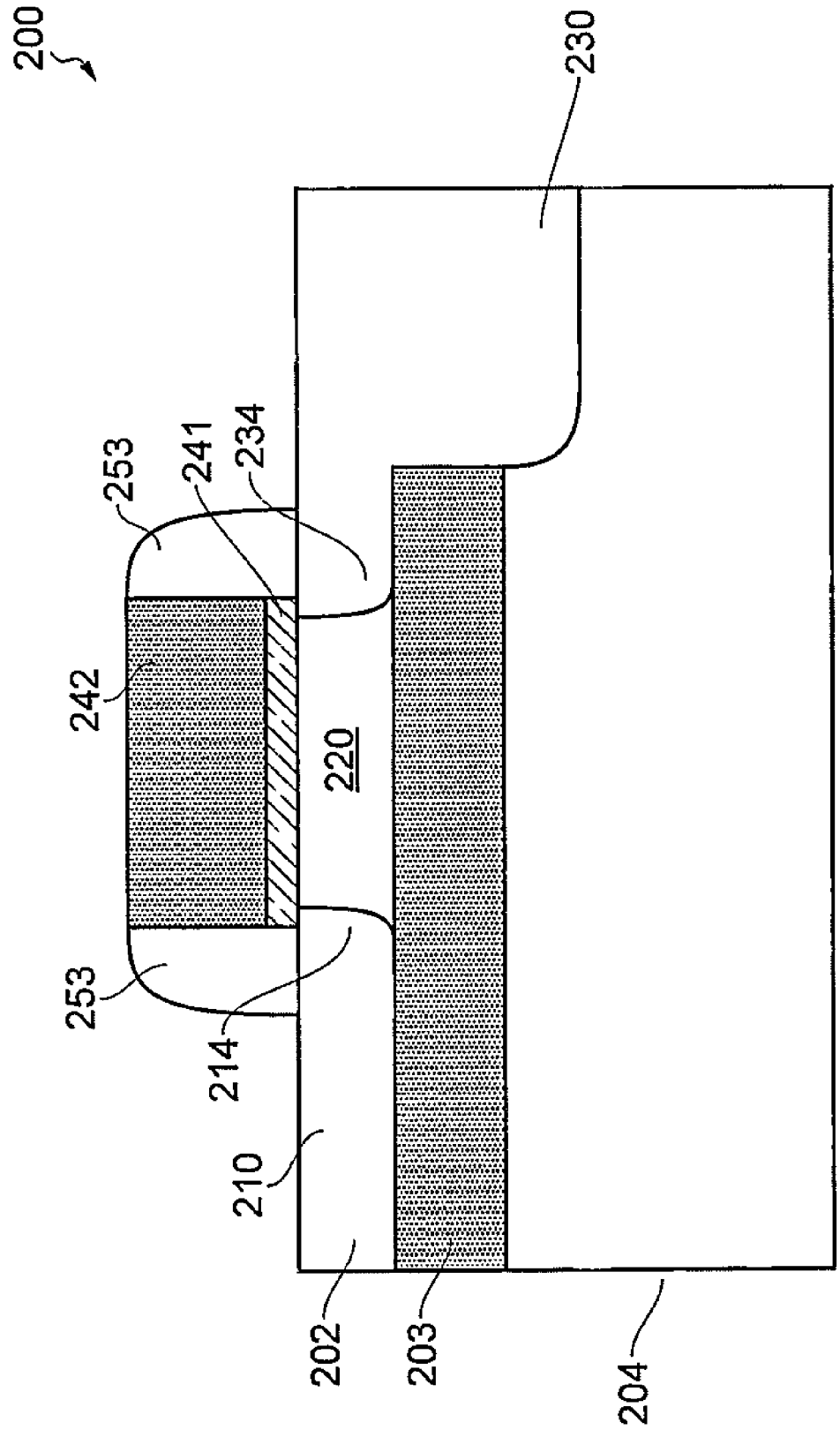

FIG. 9 shows a transistor structure 200 similar to that of FIG. 8 except that the portion of the BOX layer 203 below drain extension region 234 has not been etched to form a necked structure.

Figure 10:
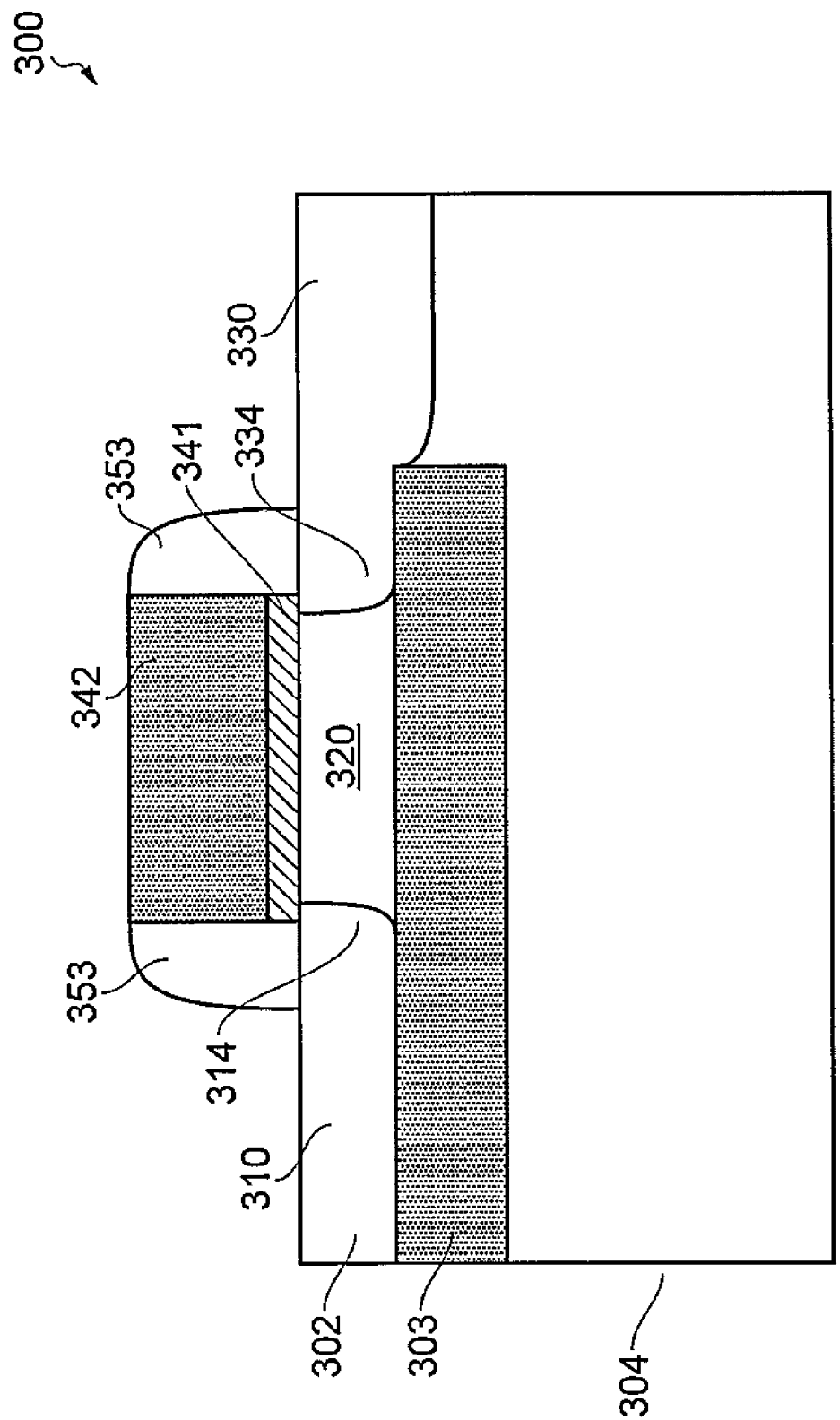

FIG. 10 shows a transistor structure 300 similar to that of FIG. 9 except that the drain region 330 of the structure of FIG. 10 does not extend below a depth of the BOX layer 303. In the embodiment of FIG. 10 the drain region 330 extends to a depth below an upper surface of the BOX layer 303 but above a lower surface of the BOX layer 303. It is to be understood that the depth to which the drain region 330 extends is dependent at least in part on a depth to which dopant ions are provided.

Other structures are also useful.

Figure 11:
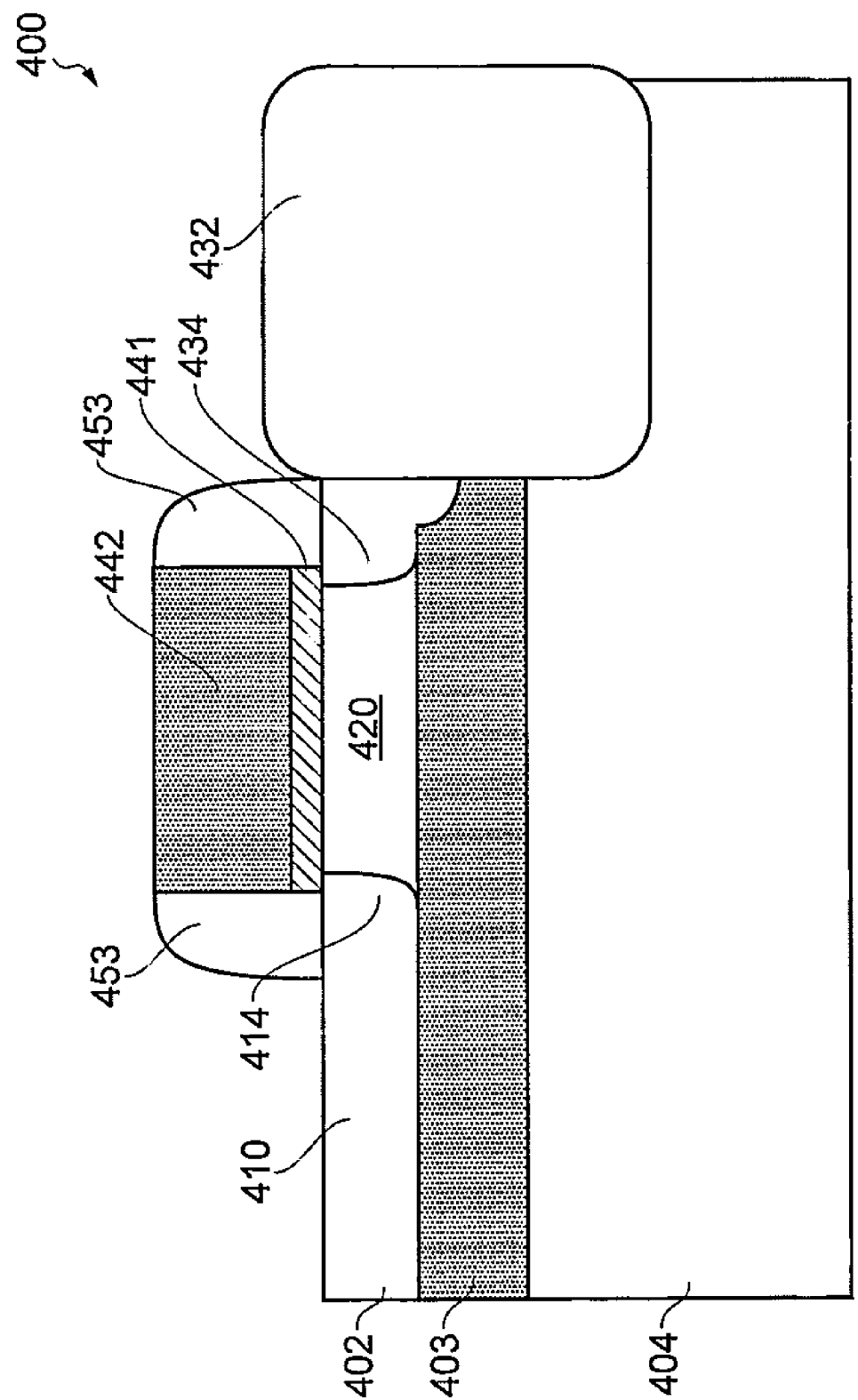

FIG. 11 shows a transistor structure 400 similar to that of FIG. 8. Like features are provided with like reference numerals prefixed with the numeral 4 instead of the numeral 1.

The structure of FIG. 11 is provided with a drain stressor portion 432. The drain stressor portion 432 is arranged to induce a strain in the channel region 420 thereby to enhance a performance of the transistor structure 400.

The drain stressor portion 432 may be formed by performing a further etching process to form a drain stressor recess following the step of re-growth of semiconductor material illustrated in FIG. 6 and described above. Drain stressor material may subsequently be formed in the drain stressor recess thereby to form the drain stressor 432.

Embodiments of the present invention have the advantage that a value of junction capacitance of a transistor device may be reduced whilst maintaining a heat dissipative path from the device to a portion of the substrate away from the upper semiconductor layer. This allows a self heating effect associated with devices formed in relatively thin semiconductor layers such as devices formed on silicon on insulator (SOI) structures to be suppressed.

Embodiments of the invention having a necked buried insulator layer such as that shown in FIG. 8 and FIG. 11 have the advantage that current crowding may be reduced thereby enhancing device performance. Provision of the necked portion increases a cross-sectional area of a flow path available for current flowing from the channel region to the drain region thereby decreasing an external series resistance of the device. The feature of a necked buried insulator layer is particularly useful in ultra thin body SOI transistor devices.

Embodiments of the invention having a buried insulator layer extending below the channel region provide a fully depleted SOI structure and have the advantage that short channel effects may be suppressed. This allows elimination of the use of halo/pocket implant structures. Furthermore, a reduction in the junction capacitance under the gate electrode ($C_{jswg}$) may be achieved. $C_{jswg}$ is understood to be a major contributor to parasitic capacitance in advanced CMOS technologies.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method of fabricating a semiconductor device comprising:
   providing a semiconductor substrate having a buried insulator layer, wherein an upper portion of the substrate is above a top surface of the buried insulator layer and a lower portion is below a bottom surface of the buried insulator layer;
   providing a gate having first and second opposing gate sidewalls, the gate includes a first sidewall spacer on the second gate sidewall; and
   forming a recess in the substrate adjacent to the second gate sidewall with the first sidewall spacer, wherein the recess extends through to the lower portion of the substrate;
   selectively forming a semiconductor material in the recess to fill the recess;
   removing the first sidewall spacer from the second gate sidewall;
   forming second sidewall spacers on the first and second gate sidewalls; and
   forming a source adjacent to the first gate sidewall and a drain adjacent to the second gate sidewall, the source and drain are separated by a channel in the upper portion of the substrate below the gate, the source has a source depth at about the top surface of the buried insulator layer and the drain has a drain depth below the top surface of the buried insulator layer to provide different drain and source depths.

2. The method as claimed in claim 1 wherein forming the recess comprises:
   anisotropically etching the substrate adjacent to the first sidewall spacer to remove the upper portion of the substrate to expose a portion of the buried insulator layer;
   isotropically etching an upper portion of the exposed portion of the buried insulator, leaving a lower portion of the exposed portion of the buried insulator layer remaining, wherein an upper portion which is removed extends below the first sidewall spacer to form a neck portion; and
   anisotropically etching remaining lower portion of the exposed portion of buried insulator layer adjacent to the first sidewall spacer and lower portion of the substrate adjacent to the first sidewall spacer.

3. The method as claimed in claim 2 wherein selectively forming the semiconductor material in the recess fills the recess including the neck portion.

4. The method as claimed in claim 3 wherein the drain depth of the drain is in the lower portion of the substrate below the bottom surface of the buried insulator layer.

5. The method as claimed in claim 2 wherein the drain depth of the drain is in the lower portion of the substrate below the bottom surface of the buried insulator layer.

6. The method as claimed in claim 1 wherein forming the recess comprises anisotropically etching the substrate adjacent to the first sidewall spacer.

7. The method as claimed in claim 6 wherein the drain depth of the drain is in the lower portion of the substrate below the bottom surface of the buried insulator layer.

8. The method as claimed in claim 6 wherein the drain depth of the drain is between the top and bottom surfaces of the buried insulator layer.

9. The method as claimed in claim 1 wherein the drain depth of the drain is in the lower portion of the substrate below the bottom surface of the insulator layer.

10. The method as claimed in claim 2 comprises forming a stressor in a drain region of the drain.

11. The method as claimed in claim 10 wherein the stressor has a top stressor surface above a top surface of the substrate.

12. The method as claimed in claim 1 comprises forming extension regions adjacent to the source and drain separated by the channel, wherein the extension regions extend under the second sidewall spacers.

13. A method of fabricating a semiconductor device comprising:
    providing a substrate having a buried insulator layer, wherein an upper portion of the substrate is above a top surface of the buried insulator layer and a lower portion is below a bottom surface of the buried insulator layer;
    providing a source region, a drain region and a channel region in the substrate; and
    forming a recess in the drain region, the recess extends through the buried insulator layer and into the lower portion of the substrate;
    selectively filling the recess with a semiconductor material; and
    forming a source in the source region and a drain in the drain region filled with the semiconductor material, the source and drain are separated by the channel, the source has a source depth at about the top surface of the buried insulator layer and the drain has a drain depth below the top surface of the buried insulator layer to provide different drain and source depths.

14. The method of claim 13 wherein a top substrate surface includes a gate with first and second gate sidewalls and a first gate sidewall spacer on a second gate sidewall, wherein the edge of the first gate sidewall spacer is aligned with an edge of the recess and the channel region is below the gate.

15. The method of claim 14 wherein forming the recess comprises:
    anisotropically etching the substrate adjacent to the first sidewall spacer to remove the upper portion of the substrate to expose a portion of the buried insulator layer;
    isotropically etching an upper portion of the exposed portion of the buried insulator, leaving a lower portion of the exposed portion of the buried insulator layer remaining, wherein an upper portion which is removed extends below the first sidewall spacer to form a neck portion;
    anisotropically etching remaining lower portion of the exposed portion of buried insulator layer adjacent to the first sidewall spacer and lower portion of the substrate adjacent to the first sidewall spacer.

16. The method of claim 15 wherein the drain depth of the drain is in the lower portion of the substrate below the bottom surface of the buried insulator layer.

17. The method of claim 14 wherein forming the recess comprises anisotropically etching the substrate adjacent to the first sidewall spacer.

18. The method of claim 17 wherein the drain depth of the drain is in the lower portion of the substrate below the bottom surface of the buried insulator layer.

19. The method of claim 13 wherein the drain depth of the drain is in the lower portion of the substrate below the bottom surface of the insulator layer.

20. The method of claim 13 comprises forming a stressor in the drain region of the drain.

21. The method of claim 20 wherein the stressor has a top stressor surface above a top surface of the substrate.

22. A method of forming a device comprising:
    providing a substrate having upper and lower portions separated by a buried insulator layer, wherein the upper portion contacts a top surface of the buried insulator layer and the lower portion contacts a bottom surface of the buried insulator; and providing a first substrate region and a second substrate region which are separated by a channel region in the upper portion, wherein the second substrate region includes a semiconductor material and extends from a top surface of the substrate through the buried insulator layer to a depth below the bottom surface of the buried insulator layer; and forming a first doped region in first substrate region and a second doped region in the second substrate region, the first and second doped regions are separated by the channel region in the upper portion of the substrate, wherein a first depth of the first doped region is at about the top surface of the buried insulator layer and a second depth of the second doped region is below the top surface of the buried insulator layer to provide different first and second doped region depths.

23. The method of claim 22 wherein the first doped region is a source of a transistor and the second doped region is a drain of the transistor.

24. The method of claim 22 wherein the buried insulator is disposed below the first doped region and channel region and not in the second doped region.

25. The method of claim 22 wherein a gate is provided on the top surface of the substrate above the channel region.

26. The method of claim 22 wherein the second substrate region comprises a stressor.

27. The method of claim 26 wherein the stressor has a top stressor surface above the substrate.

* * * * *